United States Patent
Park et al.

(10) Patent No.: US 11,881,431 B2
(45) Date of Patent: Jan. 23, 2024

(54) ANTI-FUSE WITH LATERALLY EXTENDED LINER

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (HK); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 17/456,016

(22) Filed: Nov. 22, 2021

(65) Prior Publication Data

US 2023/0163026 A1    May 25, 2023

(51) Int. Cl.
  *H01L 21/768*    (2006.01)
  *H01L 23/525*    (2006.01)
  *H01L 23/532*    (2006.01)

(52) U.S. Cl.
  CPC .... *H01L 21/76829* (2013.01); *H01L 21/7684* (2013.01); *H01L 21/76816* (2013.01); *H01L 23/5252* (2013.01); *H01L 23/53209* (2013.01); *H01L 21/76807* (2013.01)

(58) Field of Classification Search
  CPC ......... H01L 21/76829; H01L 21/76816; H01L 21/7684; H01L 23/5252; H01L 23/53209; H01L 21/76807
  See application file for complete search history.

(56) References Cited

U.S. PATENT DOCUMENTS

| | | |
|---|---|---|
| 5,602,053 A | 2/1997 | Zheng |
| 6,124,194 A | 9/2000 | Shao |
| 6,888,215 B2 | 5/2005 | Radens |
| 8,471,356 B2 | 6/2013 | Cheng |
| 8,736,020 B2 | 5/2014 | Bao |
| 8,952,488 B2 | 2/2015 | Yang |
| 9,105,637 B2 | 8/2015 | Filippi |
| 10,128,184 B2 | 11/2018 | Li |
| 2008/0157270 A1 | 7/2008 | Kim |
| 2008/0283964 A1 | 11/2008 | Yang |
| 2008/0296728 A1 | 12/2008 | Yang |
| 2010/0081274 A1* | 4/2010 | Ishizaka ............ H01L 21/76849 438/653 |
| 2013/0299940 A1 | 11/2013 | Kurz |
| 2019/0326215 A1 | 10/2019 | Reznicek |
| 2022/0415798 A1* | 12/2022 | Li ..................... H01L 21/76832 |

OTHER PUBLICATIONS

Disclosed Anonymously et al, "Method of forming anti-fuse structure in Interconnects"; IP.COM Prior Art Database Technical Disclosure, , IPCOM000240435D, Jan. 29, 2015, pp. 1-4.

\* cited by examiner

*Primary Examiner* — Thanhha S Pham
(74) *Attorney, Agent, or Firm* — Edward J. Wixted, III

(57) ABSTRACT

A capping layer is on top of a substrate. A first low-k dielectric layer is on top of the capping layer. One or more trenches are within the first low-k dielectric layer. Each of the one or more trenches have a same depth. Each trench of the one or more trenches include a barrier layer on top of the first low-k dielectric layer, a liner layer and a metal layer on top of the liner layer.

16 Claims, 20 Drawing Sheets

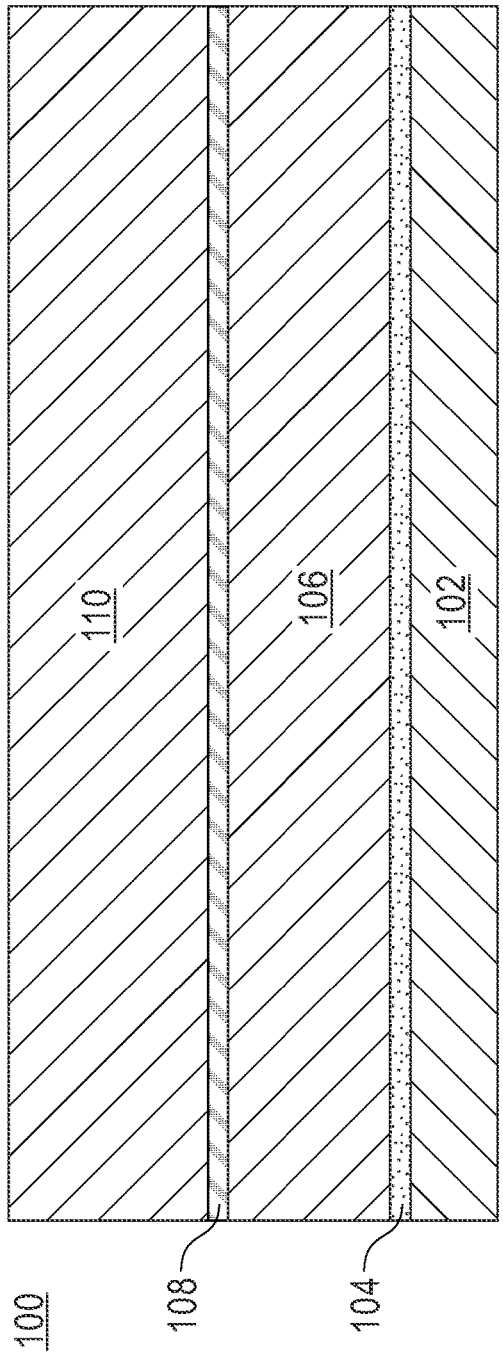
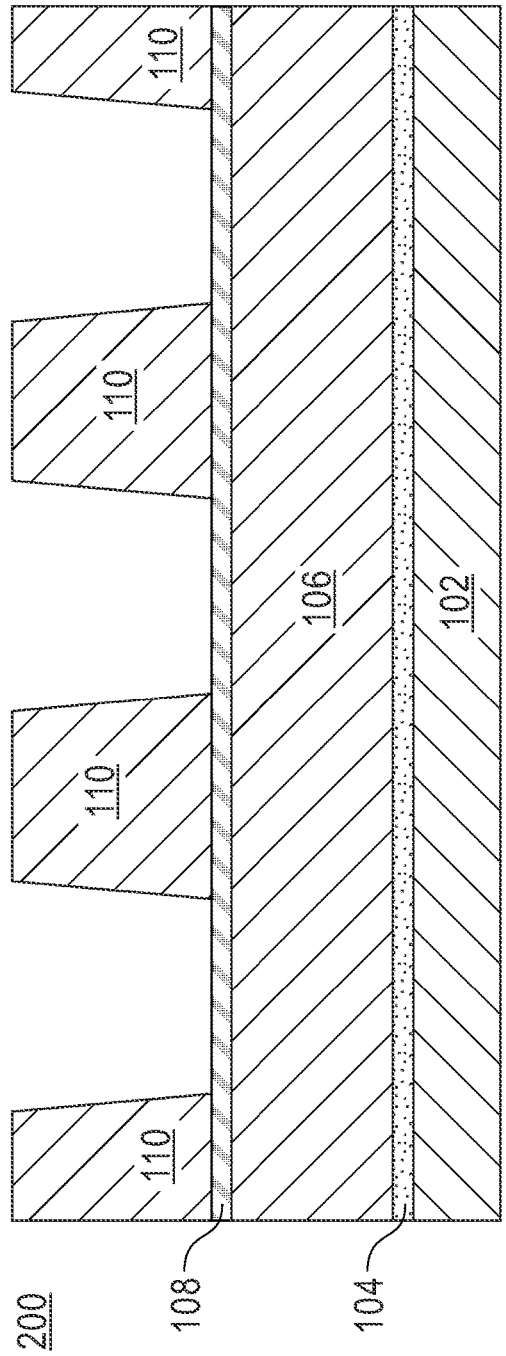

ANTI-FUSE WITH LATERALLY EXTENDED LINER

BACKGROUND OF THE INVENTION

The present invention relates generally to the field of semiconductor device manufacture and more particularly to fabricating an anti-fuse with a laterally extended liner.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

SUMMARY

Embodiments of the present invention provide for a semiconductor structure. In an embodiment, a capping layer is on top of a substrate. A first low-k dielectric layer is on top of the capping layer. One or more trenches are within the first low-k dielectric layer. Each of the one or more trenches have a same depth. Each trench of the one or more trenches include a barrier layer on top of the first low-k dielectric layer, a liner layer and a metal layer on top of the liner layer.

Embodiments of the present invention provide for a semiconductor structure. In an embodiment, a capping layer is on top of a substrate. A first low-k dielectric layer is on top of the capping layer. A first trench is within the first low-k dielectric layer. The first trench includes a first barrier layer on top of the first low-k dielectric layer, a first liner layer on top of the first barrier layer and a first metal layer on top of the first liner layer. A second trench is within the first low-k dielectric layer. The second trench includes a via within the first low-k dielectric layer. The second trench and the via include a second barrier layer on top of the first low-k dielectric layer, a second liner layer on top of the second barrier layer and a second metal layer on top of the second liner layer. The via connects to a third metal layer within the first low-k dielectric layer.

Embodiments of the represent invention provide for a method of forming a semiconductor structure. In an embodiment, a capping layer is deposited on top of a substrate. A first low-k dielectric layer is deposited on top of the capping layer. An etch stop layer is deposited on top of the first low-k dielectric layer. A second low-k dielectric layer is deposited on top of the etch stop layer. The second low-k dielectric layer is patterned to form two or more trenches. The patterning exposes at least a portion of the etch stop layer within each trench of the two or more trenches. A portion of the etch stop layer within each trench of the two or more trenches that is exposed is removed. A block mask is deposited on top of a trench of the two or more trenches. The block mask covers the first low-k dielectric layer and the etch stop layer within the trench. The exposed portion so of the etch stop layer extending laterally under the second low-k dielectric layer within two or more trenches not covered by the block mask are removed. The block mask is removed. A barrier layer is deposited within the two or more trenches. The barrier layer extends under the second low-k dielectric layer within the two or more trenches not covered by the block mask previously to form two tips. A first top of the two tips extends in the opposite direction of a second tip of the two tips.

BRIEF DESCRIPTION OF THE DRAWINGS

The above and other aspects, features, and advantages of various embodiments of the present invention will be more apparent from the following description taken in conjunction with the accompanying drawings.

FIG. 1 depicts a cross-sectional view of a semiconductor structure after depositing a capping layer on top of a substrate, depositing a first low-k dielectric layer on top of the capping layer, depositing an etch stop layer on top of the first low-k dielectric layer, and depositing a second low-k dielectric layer on top of the etch stop layer, in accordance with a first embodiment of the present invention.

FIG. 2 depicts a cross-sectional view of the semiconductor structure after patterning of the second low-k dielectric layer in accordance with a first embodiment of the present invention.

DETAILED DESCRIPTION

Figure 3:
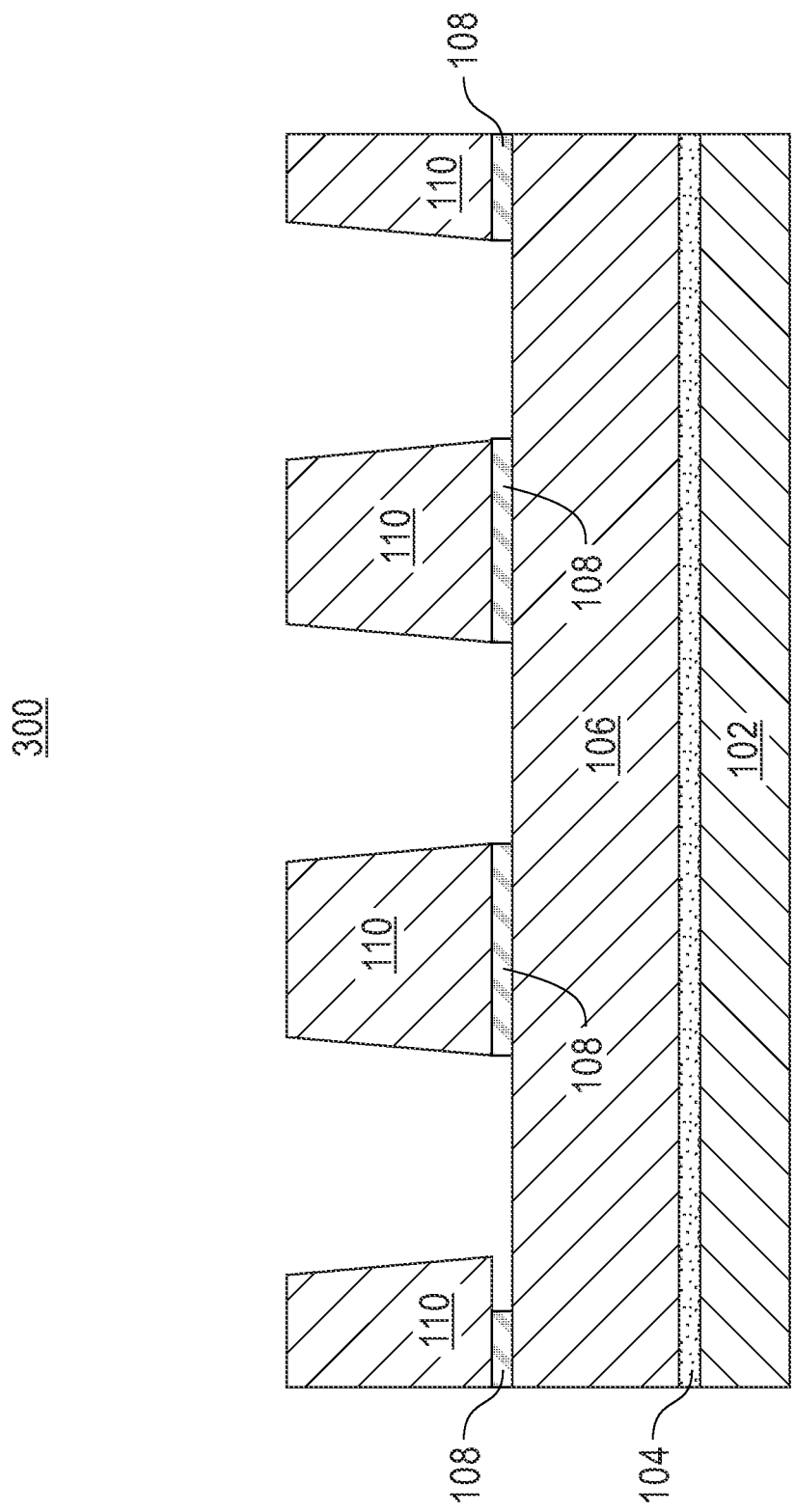
FIG. 3 depicts a cross-sectional view of the semiconductor structure after removing the exposed portions of the etch stop layer in accordance with a first embodiment of the present invention.

Embodiments of the present invention recognize that as interconnect dimension scales down in integrated circuits it is more challenging and difficult to fabricate anti-fuses. Embodiments of the present invention recognize that anti-fuses are bulky and take up a considerable amount of space in an integrated circuit. Embodiments of the present invention recognize that the considerable amount of space for packing interconnect metal wires and other components of the circuit.

Embodiments of the present invention provide for an anti-fuse that consists of laterally extended metallic liners. Embodiments of the present invention provide for the metal tips of the laterally extended metallic barrier layers to act as the "weak point" for anti-fuse application.

Embodiments of the present invention provide for an advantage of an anti-fuse that is embedded between two metal wires and therefore does not take up a considerable amount of space. Embodiments of the present invention provide for an embedded anti-fuse that can be integrated into interconnects with sub-15 nm spacing. Embodiments of the present invention provide for spacing between the two metal tips of the "weak point" of the anti-fuse that can be precisely controlled. Embodiments of the present invention provide for an advantage of metallic barrier tips that can be easily integrated into narrow-pitch interconnect.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-11 depict a structure and method of forming an anti-fuse between two metal wires, in accordance with a first embodiment of the invention.

FIG. 1 depicts a cross-sectional view of the semiconductor structure 100 after depositing a capping layer 104 on top of the substrate 102, depositing a first low-k dielectric layer 106 on top of the capping layer 104, depositing an etch stop layer 108 on top of the first low-k dielectric layer 106, and depositing a second low-k dielectric layer 110 on top of the etch stop layer 108 in accordance with a first embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, substrate 102 may be a level of interconnect wiring. For example, modern semiconductor chips may have fifteen or more levels of interconnect wiring, labeled M1-M15, so if this structure was to be used at the M2 metal level, in other words M2 metal level as substrate 102, then the M1 metal level would be located below it. In an embodiment, the capping layer 104 may be SiCN, or any other material known in the art. In an embodiment, the capping layer 104 may be deposited using PVD, CVD, ALD, or any other process known in the art. In an embodiment, capping layer 104 may range in thickness from 1 nm to 10 nm but is not limited to this range.

As shown in FIG. 1, a first low-k dielectric layer 104 is deposited on top of the capping layer 104. In an embodiment, the first low-k dielectric layer 104 may be any insulator having a dielectric constant of less than silicon dioxide, i.e., less than about 4.0. In an alternative embodiment, the first low-k dielectric layer 104 may have a dielectric constant of less than 3.5. In an embodiment, the first low-k dielectric layer 104 may be deposited and formed using known dielectric material deposition methods. In an embodiment, the first low-k dielectric layer 104 may range in thickness from 10 nm to 60 nm but is not limited to this range. In an embodiment, the etch stop layer 108 may be AlOx (Aluminum Oxide) or any other etch stop material known in the art. In an embodiment, etch stop layer 318 may range in thickness from 1 nm to 10 nm but is not limited to this range.

As shown in FIG. 1, a second low-k dielectric layer 110 is deposited on top of the etch stop layer 108. In an embodiment, the second low-k dielectric layer 110 may be any insulator having a dielectric constant of less than silicon dioxide, i.e., less than about 4.0. In an alternative embodiment, the second low-k dielectric layer 110 may have a dielectric constant of less than 3.5. In an embodiment, the second low-k dielectric layer 110 may be deposited and formed using known dielectric material deposition methods. In an embodiment, the second low-k dielectric layer 110 may range in thickness from 10 nm to 60 nm but is not limited to this range.

FIG. 2 depicts a cross-sectional view of the semiconductor structure 200 after patterning of the second low-k dielectric layer 110. The second low-k dielectric layer 110 is patterned to form horizontal lines (trenches) between the second low-k dielectric layer 110. In an embodiment, as shown, three horizontal lines are patterned. In an alternative embodiment, any number of horizontal lines may be patterned in the second low-k dielectric layer 110. In an embodiment, the width of lines may range from 6 nm to 40 nm but is not limited to this range. In an embodiment, the horizontal lines (trenches) are patterned to a depth of the etch stop layer 108 so as to have all trenches have the same depth.

FIG. 3 depicts a cross-sectional view of the semiconductor structure 300 after removal of the exposed portions of the etch stop layer 108. The exposed portions of etch stop layer 108 in the 2D horizontal lines is selectively removed to exposed portions of the first low-k dielectric layer 106. Portions of etch stop layer 108 below the second low-k dielectric layer 110 remain.

Figure 4:
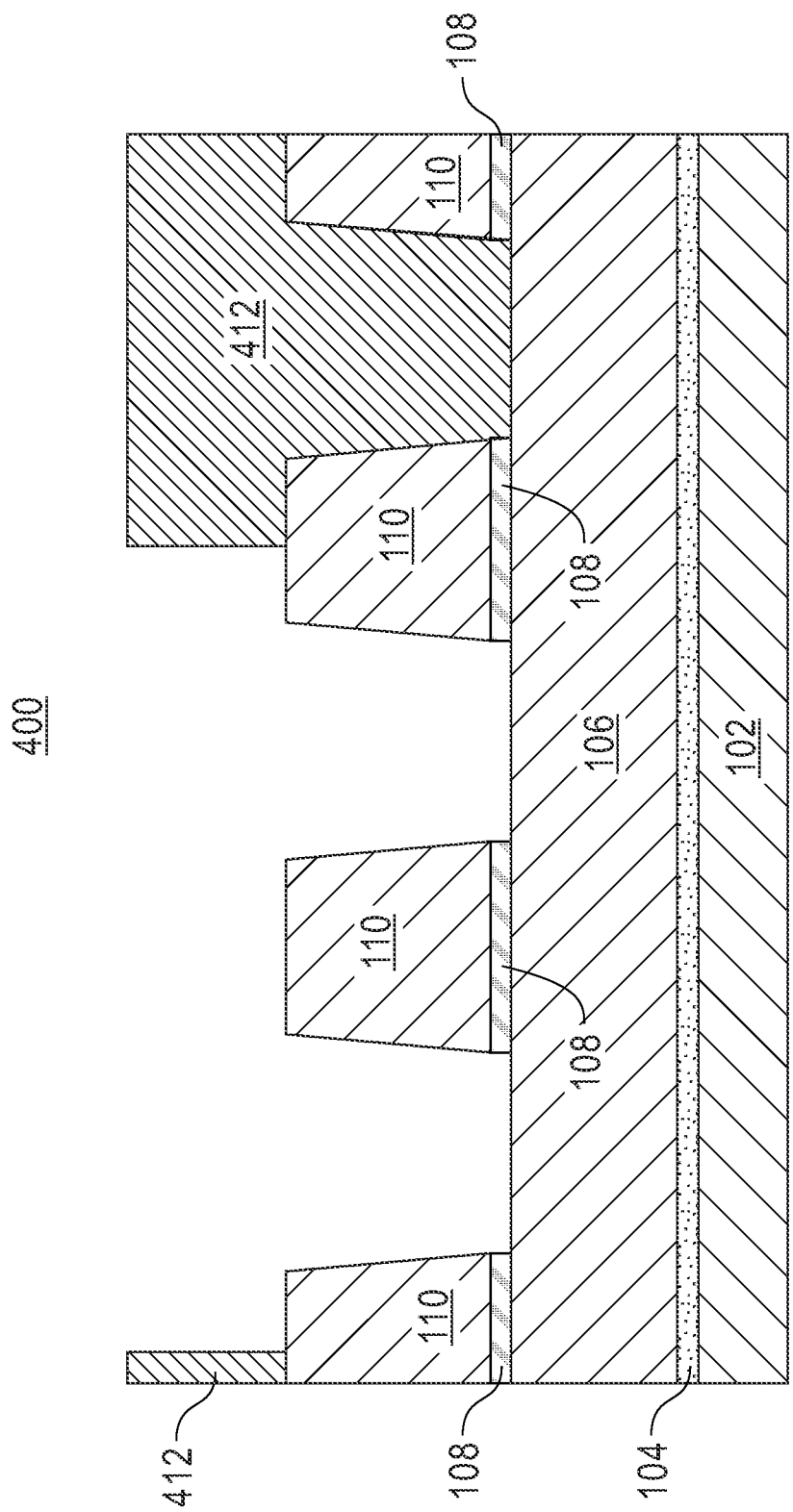
FIG. 4 depicts a cross-sectional view of the semiconductor structure after depositing a block mask layer in accordance with a first embodiment of the present invention.

FIG. 4 depicts a cross-sectional view of the semiconductor structure 400 after deposition of a block mask 412. A block mask 412 is selectively deposited on top of structure 400. In an embodiment, the block mask 412 covers and/or fills any trenches that do not want further removal of the etch stop layer 108. In an embodiment, the block mask 412 does not cover and/or fill any trenches that want further removal of the etch stop layer. In an embodiment, block mask 412 may be an optical planarization layer as known in the art. In an embodiment, an optical planarization layer may comprise spin-on-carbon. In an embodiment, the block mask 412 may range in thickness from 60 nm to 200 nm but is not limited to this thickness. In an embodiment, the block mask 412 may be formed by performing a spin-coating process and thereafter drying the OPL material.

Figure 5:
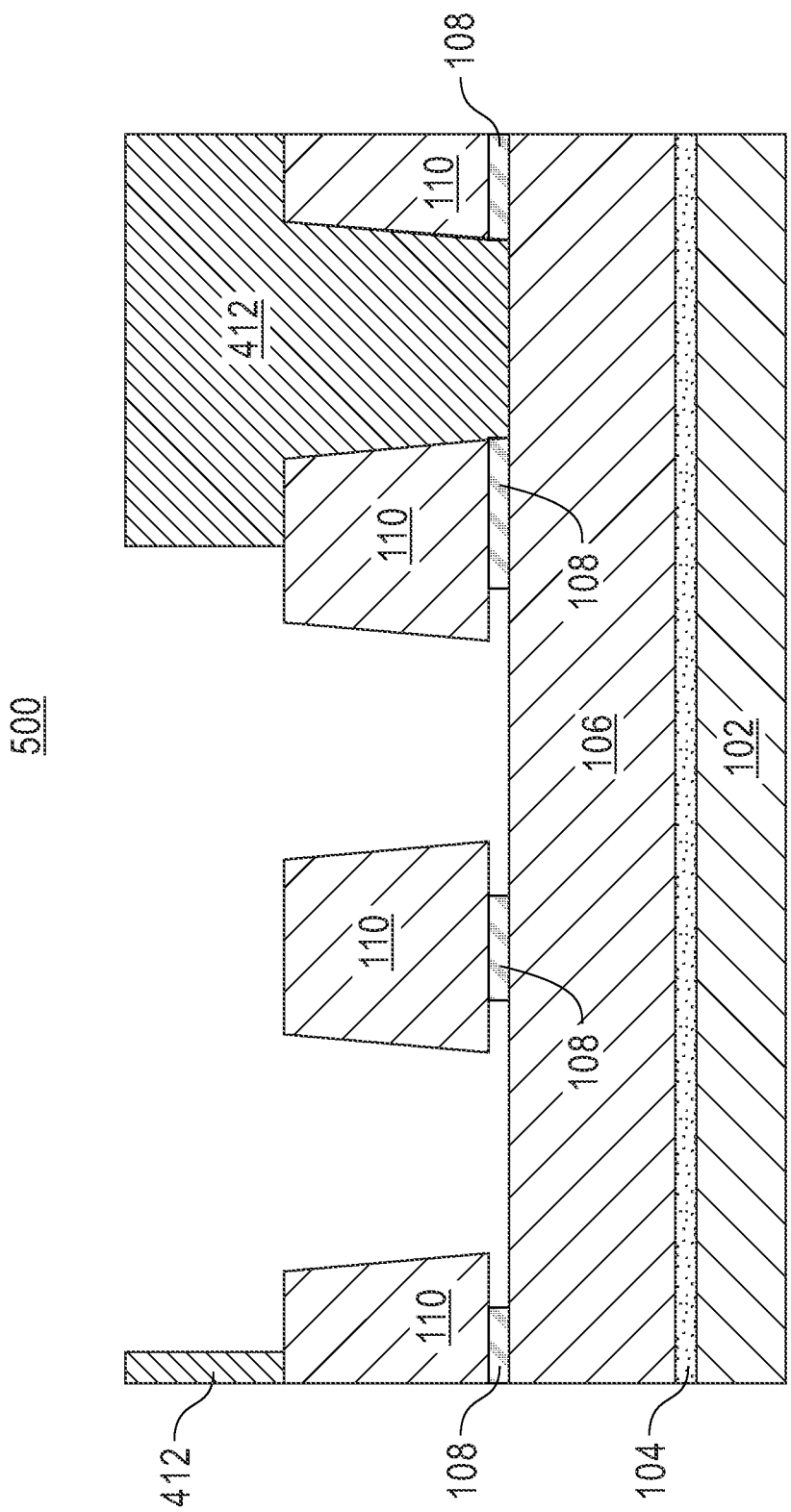
FIG. 5 depicts a cross-sectional view of the semiconductor structure after removing the exposed portions of the etch stop layer in accordance with a first embodiment of the present invention.

FIG. 5 depicts a cross-sectional view of the semiconductor structure 500 after removing the exposed portions of the etch stop layer 108. The exposed portions of the etch stop layer 108 not covered by the block mask 412 are laterally etched using wet etching or any other etching process known in the art. In an embodiment, the exposed portions of the etch stop layer 108 not covered by the block mask 412 are etched using anisotropic etch processes. In an embodiment, 3 nm to 40 nm of lateral distance of etch stop layer 108 are removed but it is not limited to this range. In an embodiment, the lateral etch range of etch stop layer 108 is dependent on the pitch of the metal lines. In an embodiment, deeper wet etching is needed the wider the pitch of the metal lines.

Figure 6:
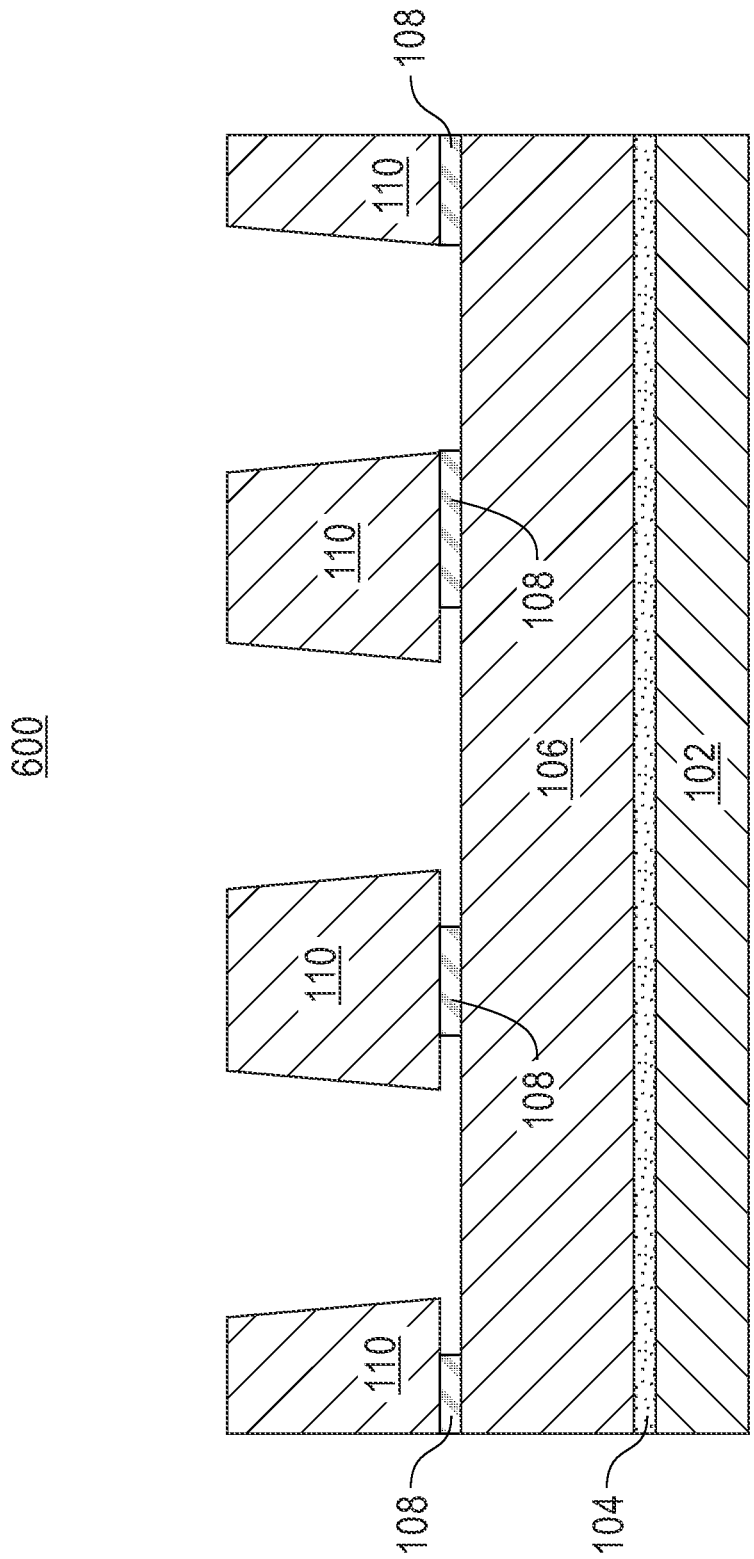
FIG. 6 depicts a cross-sectional view of the semiconductor structure after removing the block mask layer in accordance with a first embodiment of the present invention.

FIG. 6 depicts a cross-sectional view of the semiconductor structure 600 after the removal of the block mask 412. The block mask 412 is selectively removed using etching or any other process known in the art.

Figure 7:
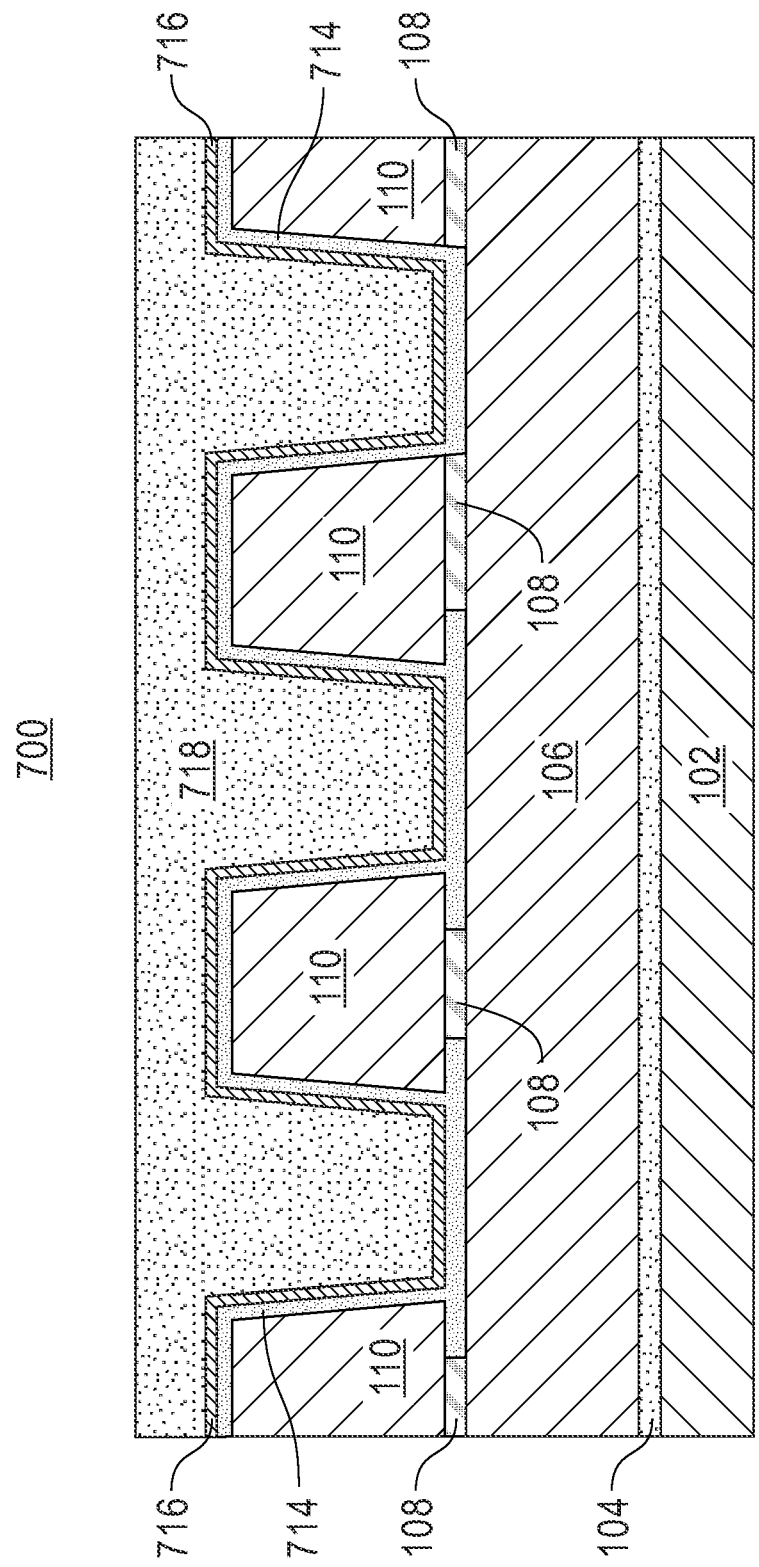
FIG. 7 depicts a cross-sectional view of the semiconductor structure after depositing a barrier layer on top of the first low-k layer, the second low-k dielectric layer and up to the exposed portions of the etch stop layer between the first low-k dielectric layer and the second low-k dielectric layer, depositing a liner layer on top of the barrier layer and depositing a metal layer on top of the liner layer in accordance with a first embodiment of the present invention.

FIG. 7 depicts a cross-sectional view of the semiconductor structure 700 after depositing a barrier layer 714 on top of the first low-k dielectric layer 106, second low-k dielectric layer 110 and up to the exposed portions of the etch stop layer 108 between the first low-k dielectric layer 106 and second low-k dielectric layer 110. A liner layer 716 is deposited on top of the barrier layer 714 and a metal layer 718 is deposited on top of the liner layer 716 in accordance with a first embodiment of the present invention. In an embodiment, barrier layer 714 is TaN, Ta, TiN, WN, or any other material known in the art. In an embodiment, barrier layer 714 is deposited via sputtering, ALD, CVD, or any other process known in the art. In an embodiment, barrier layer 714 may range from 0.5 nm to 5 nm in thickness but is not limited to this range. In an embodiment, the barrier layer 714 is deposited between the second low-k dielectric layer 110 and the first low-k dielectric layer 106 to form adjacent to the remaining exposed portions of the etch stop layer 108 to form tips of the out of the one or more trenches within the second low-k dielectric layer 110. In an embodiment, a liner layer 716 is deposited on top of the barrier layer 714 via sputtering, ALD, CVD, or any other process known in the art. In an embodiment, liner layer 716 is Ru, Co, any combination of Ru/Co, or any other material known in the art. In an embodiment, liner layer 716 may range in thickness from 0.5 nm to 5 nm but is not limited to this range. In an embodiment, a metal layer 718 is deposited on top of the liner layer 716. In an embodiment, the metal layer 718 is deposited using ECP, PVD, CVD, ALD, or any other process known in the art. In an embodiment, metal layer 718 is Cu, Ru, W, Mo, Ir, Rh or any other material known in the art.

Figure 8:
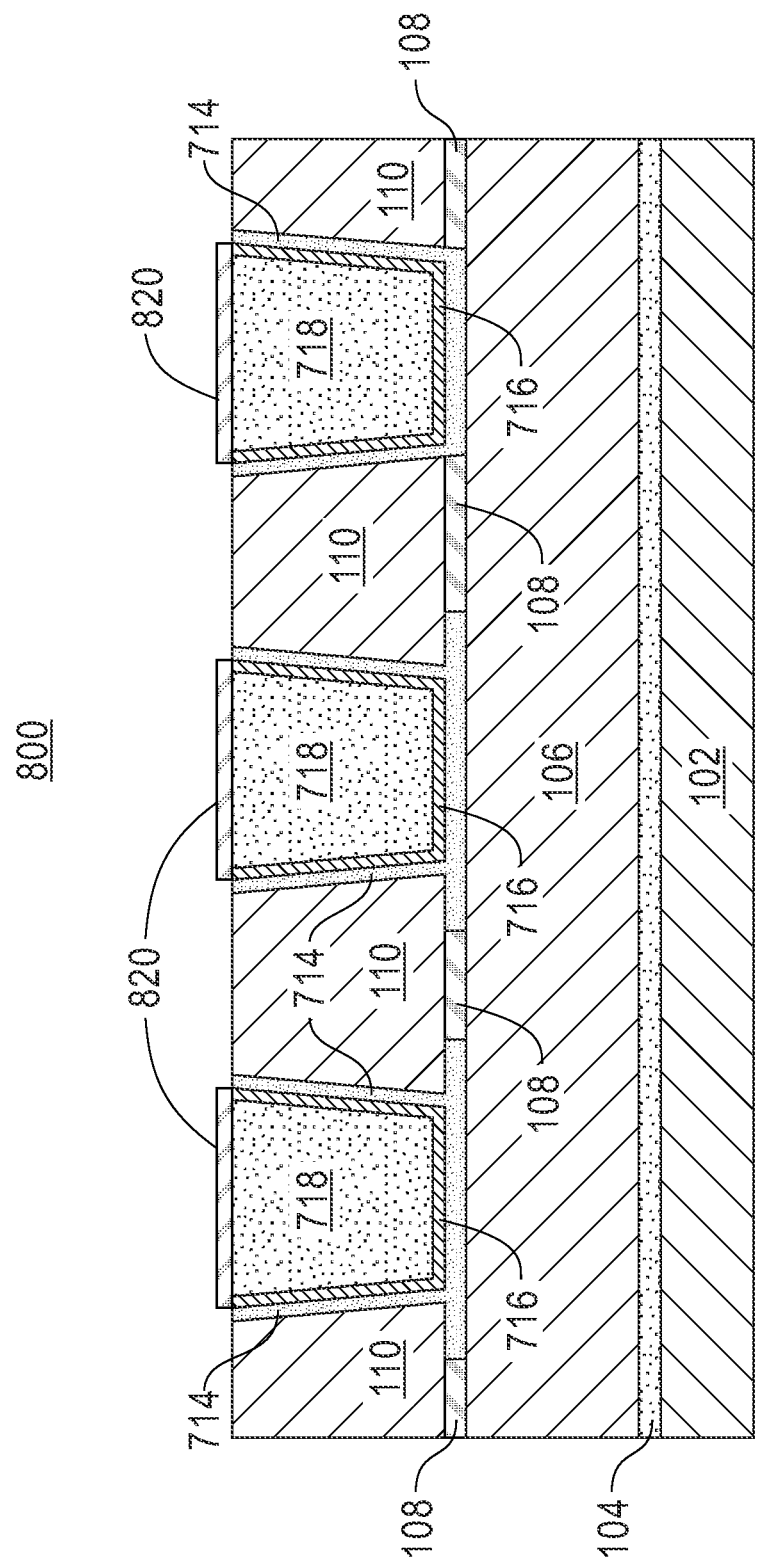
FIG. 8 depicts a cross-sectional view of the semiconductor structure after planarizing the semiconductor structure to remove the barrier layer, liner layer, and metal layer located above the top of the second low-k dielectric layer and additional depositing of a metal cap on top of the remaining metal layer in accordance with a first embodiment.

FIG. 8 depicts a cross-sectional view of the semiconductor structure 800 after planarization of the semiconductor structure to remove the barrier layer 714, liner layer 716 and metal layer 718 located above the top of the second low-k dielectric layer 110. A metal cap 820 is deposited on top of the metal layer 718 remaining in the patterned 2D horizontal lines. In an embodiment, metal cap 820 is Cu, Ru, W, Mo, Jr, Rh or any other material known in the art. In an embodiment, the metal cap 820 is deposited via areaselective deposition. In an embodiment, metal cap 820 may range in thickness from 0.5 nm to 5 nm but is not limited to this range.

Figure 9:
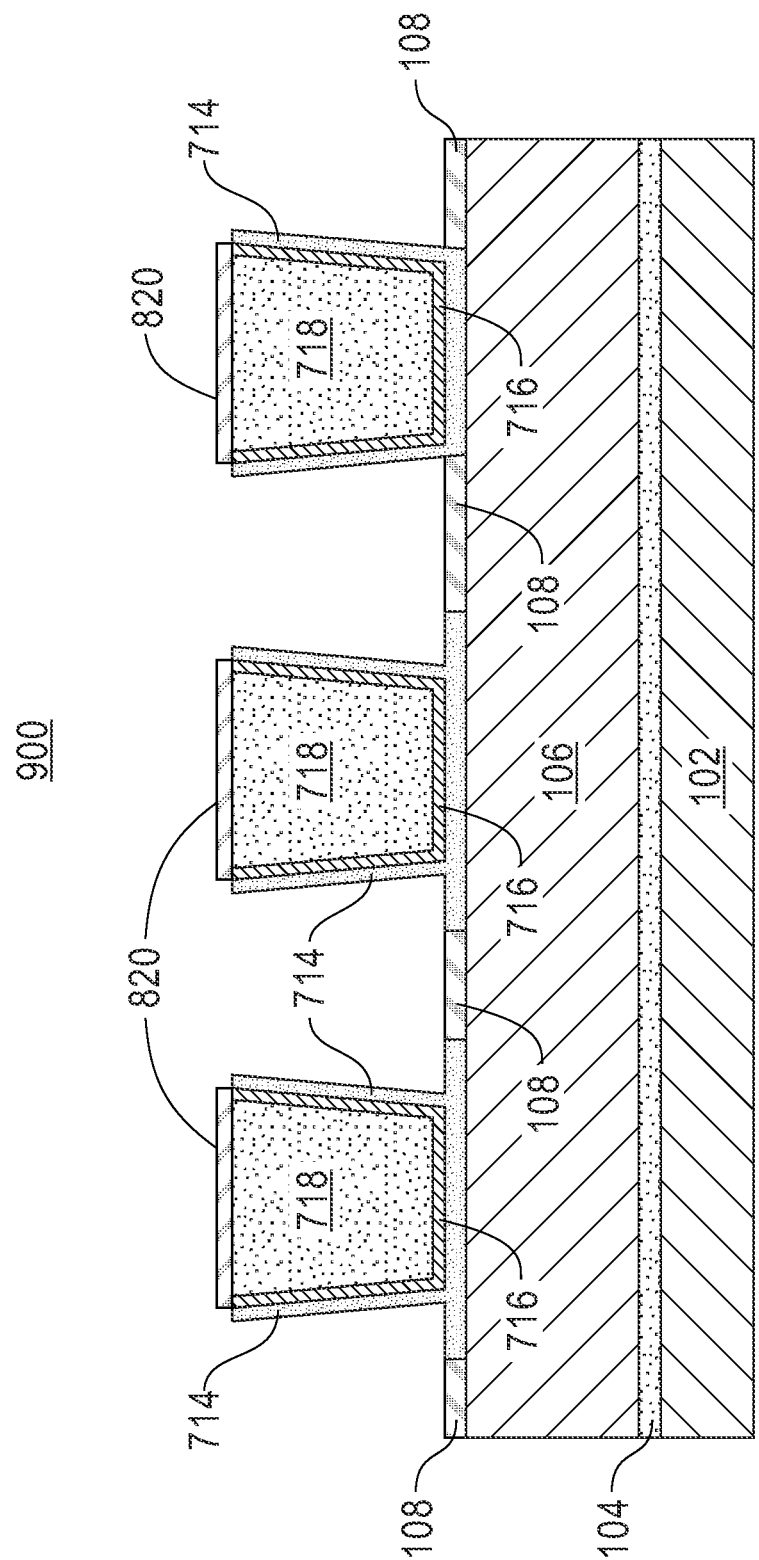
FIG. 9 depicts a cross-sectional view of a semiconductor structure after selectively removing the second low-k dielectric layer in accordance with a first embodiment of the present invention.

FIG. 9 depicts a cross-sectional view of the semiconductor structure 900 after selective removal of the second low-k dielectric layer 110. In an embodiment, the second low-k dielectric layer 110 is selectively removed using etching or any other process known in the art.

Figure 10:
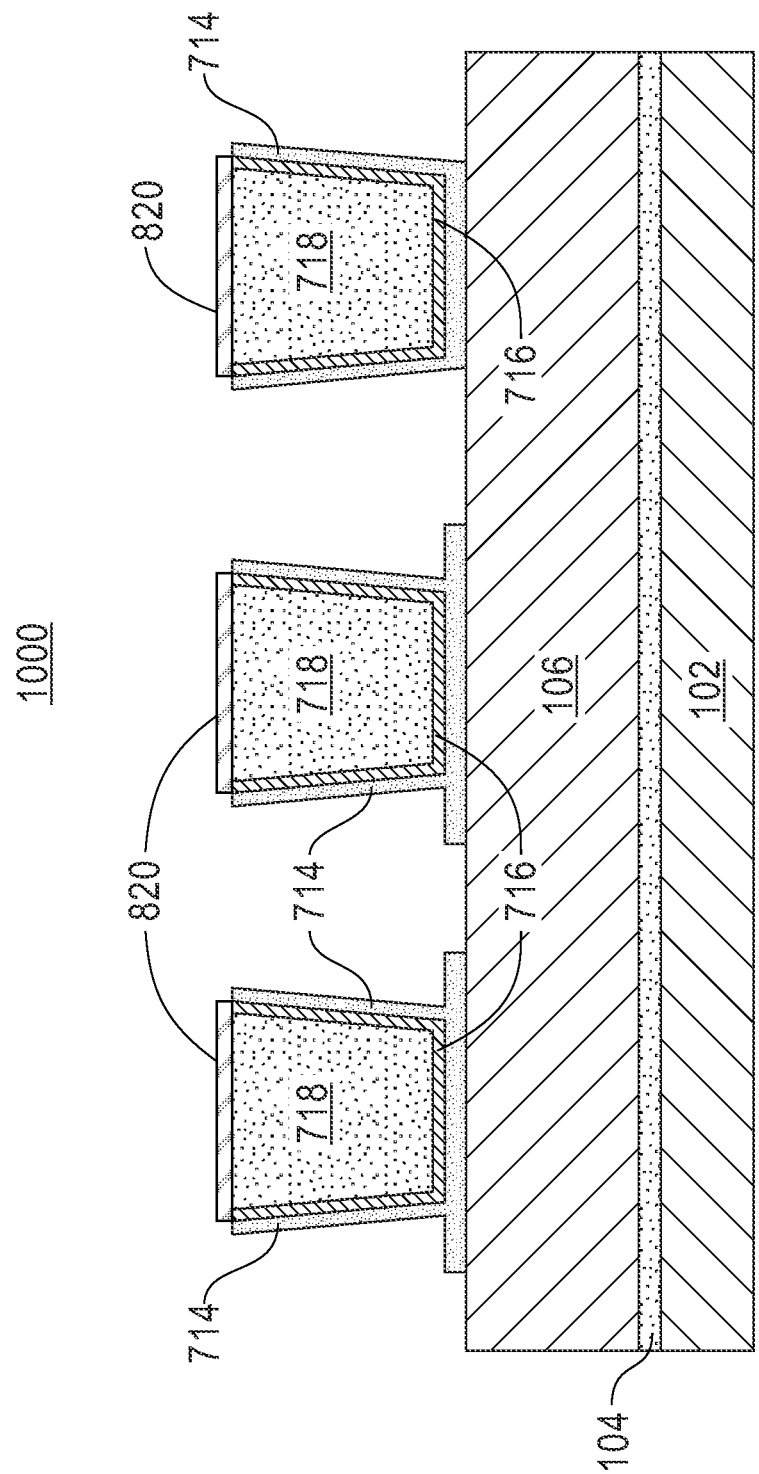
FIG. 10 depicts a cross-sectional view of the semiconductor structure after removing the second low-k dielectric layer in accordance with a first embodiment of the present invention.

FIG. 10 depicts a cross-sectional view of the semiconductor structure 1000 after removal of the remaining etch stop layer 108. In an embodiment, the etch stop layer 108 is removed using processes known in the art, including, but not limited to wet etching using diluted hydrofluoric acid (dHF).

Figure 11:
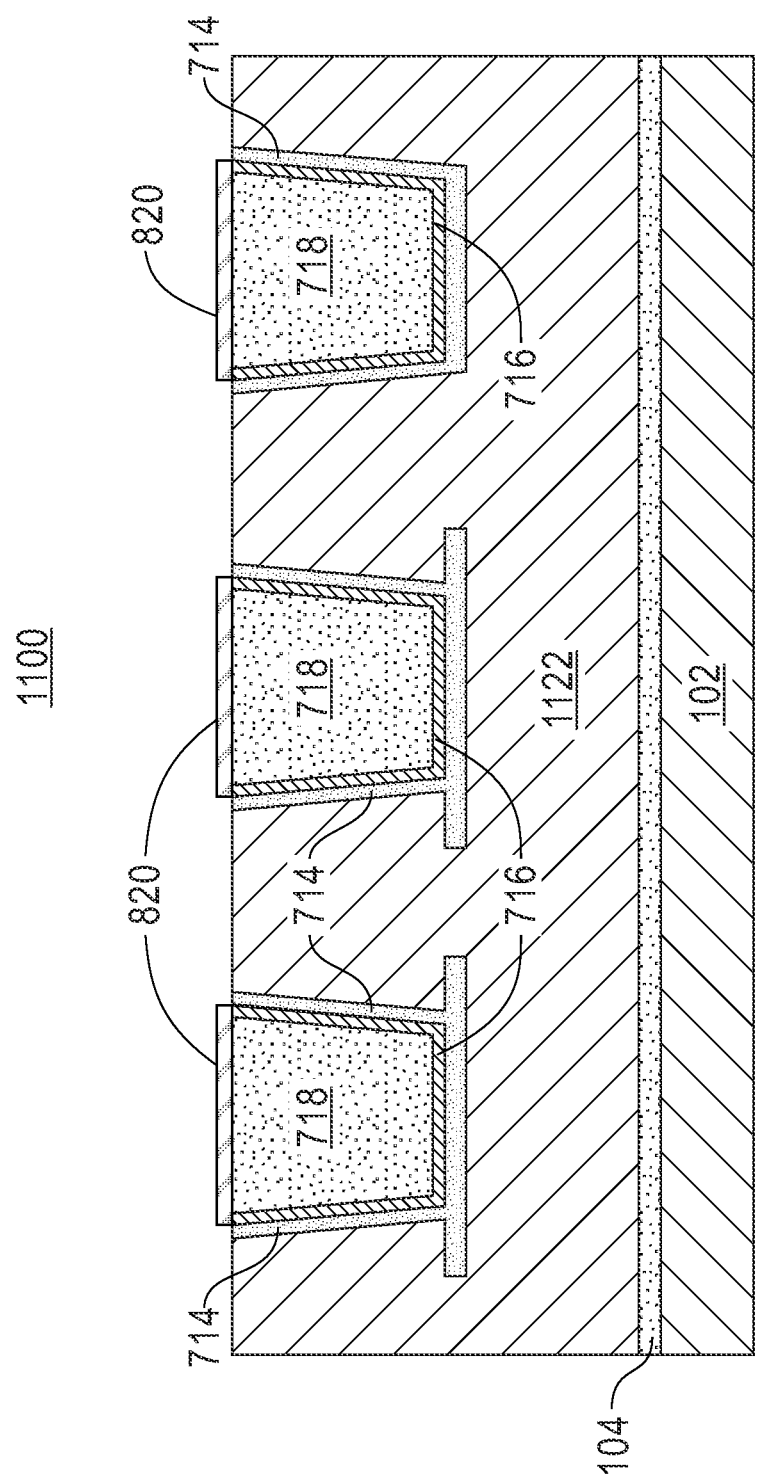
FIG. 11 depicts a cross-sectional view of a semiconductor structure with metal deposition upon a substrate to form a first metal layer in accordance with a first embodiment of the present invention.

FIG. 11 depicts a cross-sectional view of the semiconductor structure 1100 after depositing a third low-k dielectric layer 1122. It should be noted, for simplicity the third low-k dielectric layer 1122 is depicted as a single layer however the third low-k dielectric layer 1122 includes parts of the first low-k dielectric layer 106. The third low-k dielectric layer 1122 is deposited at least to the bottom of the metal cap 820 and planarized to the bottom of the metal cap 820.

FIGS. 12-21 depict a structure and method of forming an anti-fuse in a dual-damascene interconnect structure, in accordance with a second embodiment of the invention.

Figure 12:
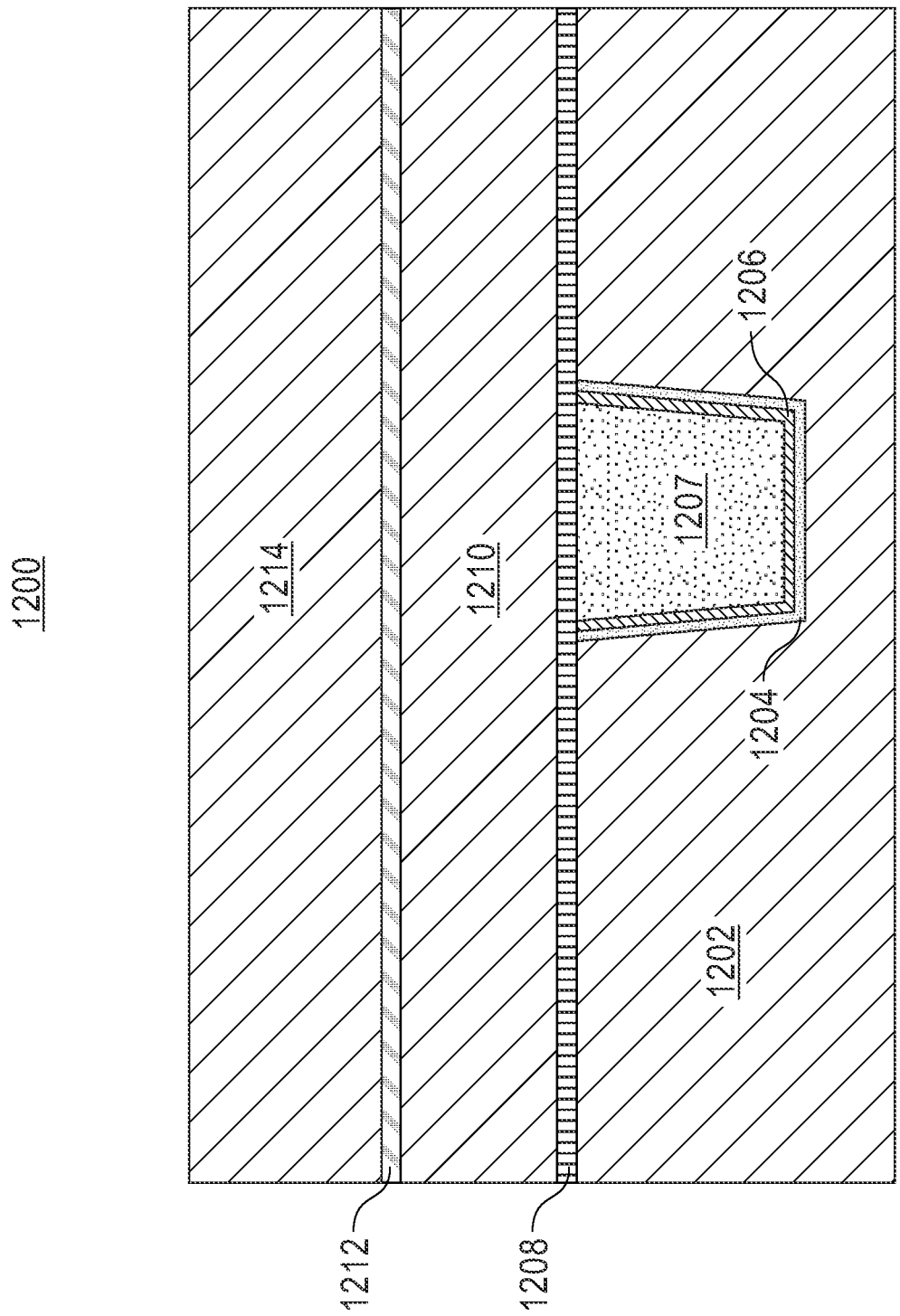
FIG. 12 depicts a cross-sectional view of the semiconductor structure after depositing a capping layer on top of the substrate, depositing a first low-k dielectric layer on top of the capping layer, depositing an etch stop layer on top of the first low-k dielectric layer, and depositing a second low-k dielectric layer on top of the etch stop layer in accordance with a second embodiment of the present invention.

FIG. 12 depicts a cross-sectional view of the semiconductor structure 1200 after depositing a capping layer 1208 on top of the substrate 1202, depositing a first low-k dielectric layer 1210 on top of the capping layer 1208, depositing an etch stop layer 1212 on top of the first low-k dielectric layer 1210, and depositing a second low-k dielectric layer 1214 on top of the etch stop layer 1212 in accordance with a second embodiment of the present invention. In an embodiment, substrate 1202 may be a bulk semiconductor, a layered semiconductor substrate such as Si/SiGe, a silicon-on-insulator substrate (SOI), or a SiGeon-insulator substrate (SGOI). The substrate 1202 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, substrate 102 may be a level of interconnect wiring. For example, modern semiconductor chips may have fifteen or more levels of interconnect wiring, labeled M1-M15, so if this structure was to be used at the M2 metal level, in other words M2 metal level as substrate 102, then the M1 metal level would be located below it.

In a second embodiment, substrate 1202 has a metal layer 1207 within substrate 1202. In an embodiment, metal layer 1207 may be composed of a metal material or a metal alloy. For example, metal layer 1207 can be composed one the following metals or metal alloys including but not limited to Cu, W, Ru, TiN, Co, Al, Rh, Jr, Ni, Ta, and alloys of these metals. In an embodiment, the capping layer 1208 may be SiCN, or any other material known in the art. In an embodiment, between metal layer 1207 and substrate 1202 there may be a barrier layer 1204 and a liner layer 1206. In an embodiment, barrier layer 1204 is TaN, Ta, TiN, WN, or any other material known in the art. In an embodiment, barrier layer 1204 is deposited via sputtering, ALD, CVD, or any other process known in the art. In an embodiment, barrier layer 1204 may range from 0.5 nm to 5 nm in thickness but is not limited to this thickness. In an embodiment, a liner layer 1206 is deposited on top of the barrier layer 1204 via sputtering, ALD, CVD, or any other process known in the art. In an embodiment, liner layer 1206 is Ru, Co, any combination of Ru/Co, or any other material known in the art. In an embodiment, liner layer 1206 may range in thickness from 0.5 nm to 5 nm but is not limited to this thickness. In an embodiment, the capping layer 1208 may be deposited using PVD, CVD, ALD, or any other process known in the art. In an embodiment, capping layer 104 may range in thickness from 1 nm to 10 nm but is not limited to this thickness.

As shown in FIG. 12, a first low-k dielectric layer 1210 is deposited on top of the capping layer 1208. In an embodiment, the first low-k dielectric layer 1210 may be any insulator having a dielectric constant of less than silicon dioxide, i.e., less than about 4.0. In an alternative embodiment, the first low-k dielectric layer 1210 may have a dielectric constant of less than 3.5. In an embodiment, the first low-k dielectric layer 1210 may be deposited and formed using known dielectric material deposition methods. In an embodiment, the first low-k dielectric layer 1210 may range in thickness from 10 nm to 60 nm but is not limited to this range. In an embodiment, the etch stop layer 1212 may be AlOx (Aluminum Oxide) or any other etch stop material known in the art. In an embodiment, etch stop layer 1212 may range in thickness from 1 nm to 10 nm but is not limited to this range.

As shown in FIG. 12, a second low-k dielectric layer 1214 is deposited on top of the etch stop layer 1212. In an embodiment, the second low-k dielectric layer 1214 may be any insulator having a dielectric constant of less than silicon dioxide, i.e., less than about 4.0. In an alternative embodiment, the second low-k dielectric layer 1214 may have a dielectric constant of less than 3.5. In an embodiment, the second low-k dielectric layer 1214 may be deposited and formed using known dielectric material deposition methods. In an embodiment, the second low-k dielectric layer 1214 may range in thickness from 10 nm to 60 nm but is not limited to this range.

Figure 13:
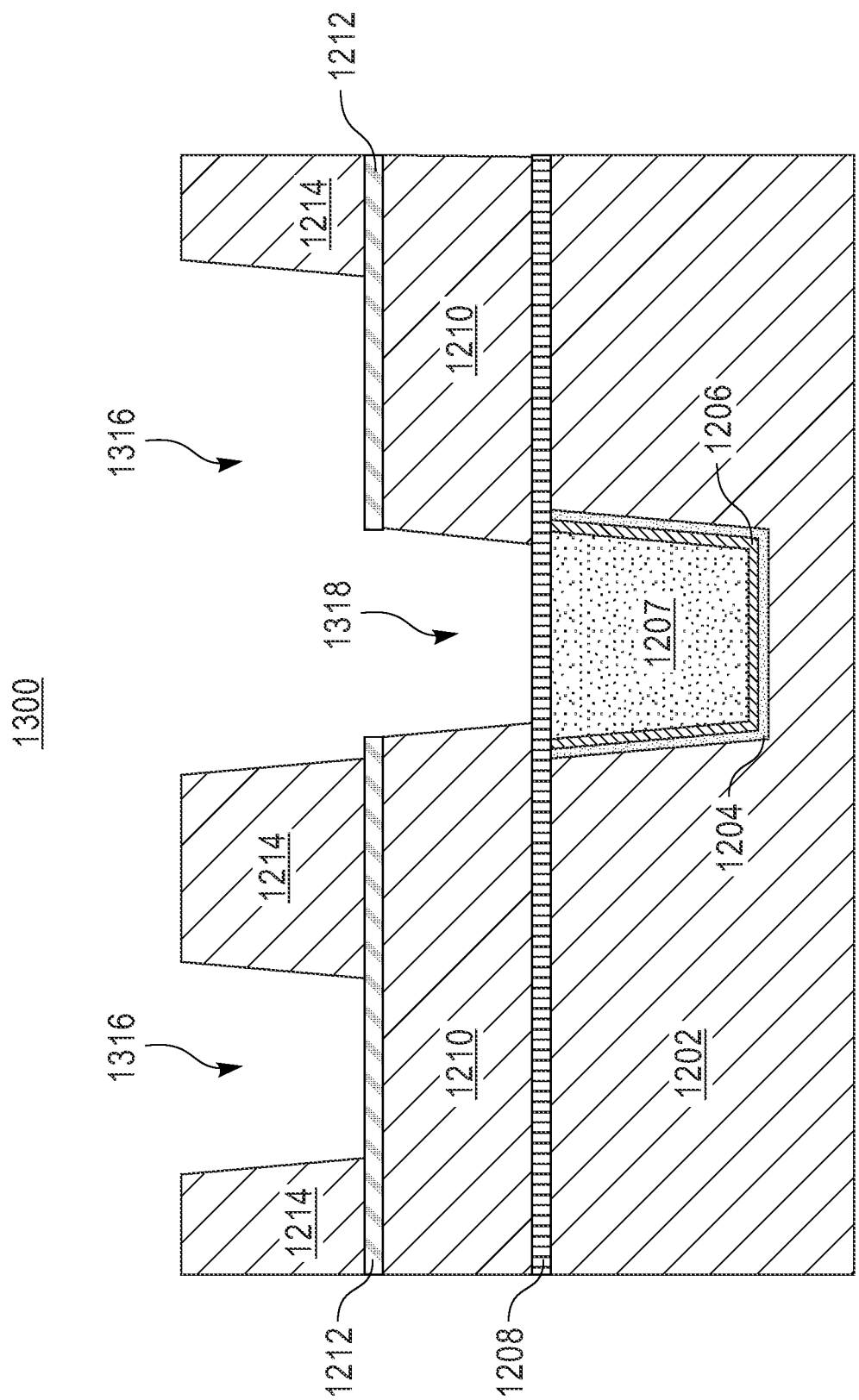
FIG. 13 depicts a cross-sectional view of the semiconductor structure after patterning of the second low-k dielectric layer in accordance with a second embodiment of the present invention.

FIG. 13 depicts a cross-sectional view of the semiconductor structure 1300 after patterning of the second low-k dielectric layer 1214. The second low-k dielectric layer 1214 is patterned to form 2D horizontal lines (trenches) between the second low-k dielectric layer 1214. In an embodiment, as shown, two horizontal lines are patterned. In an alternative embodiment, any number of horizontal lines may be patterned in the second low-k dielectric layer 1214. In an embodiment, the width of lines may range from 6 nm to 40 nm but is not limited to this range. In an embodiment, the 2D horizontal lines (trenches) 1316 are patterned to a depth of the etch stop layer 1212 so as to have all trenches have the same depth. In an embodiment, the first low-k dielectric layer is also patterned to form a via 1318. In an embodiment, as shown, a single via 1318 is formed. In an alternative embodiment, any number of vias may be patterned in the first low-k dielectric layer 1210. In an embodiment, the vias are patterned to a depth of the capping layer 1208.

Figure 14:
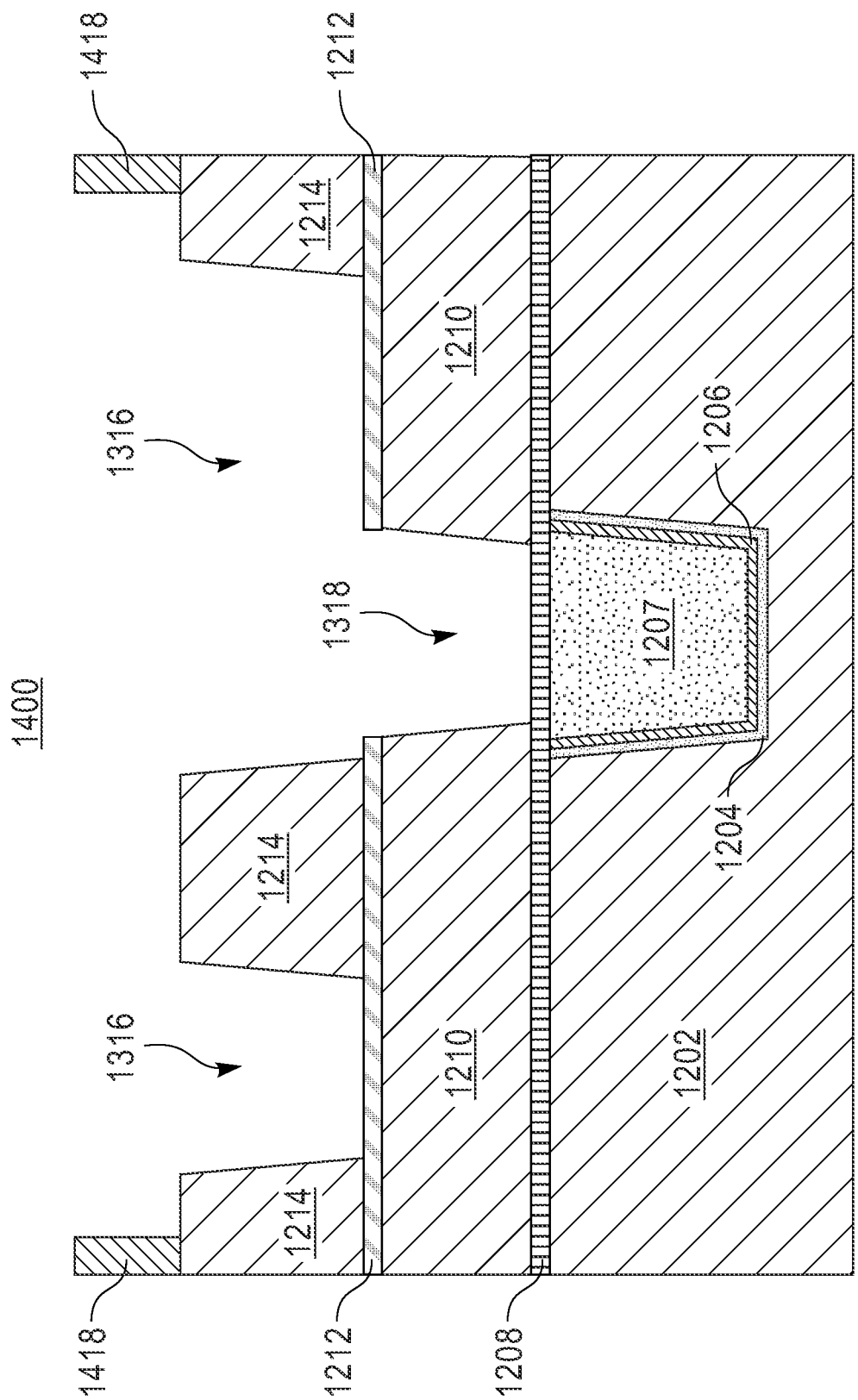
FIG. 14 depicts a cross-sectional view of the semiconductor structure after depositing a block mask layer in accordance with a second embodiment of the present invention.

FIG. 14 depicts a cross-sectional view of the semiconductor structure 1400 after deposition of a block mask 1418. A block mask 1418 is selectively deposited on top of structure 1400. In an embodiment, the block mask 1418 covers and/or fills any trenches that do not want further removal of the etch stop layer 1212. In an embodiment, the block mask 1418 does not cover and/or fill any trenches that want further removal of the etch stop layer 1218. In an embodiment, block mask 1418 may be an optical planarization layer as known in the art. In an embodiment, an optical planarization layer may comprise spin-on-carbon. In an embodiment, the block mask 1418 may range in thickness from 60 nm to 200 nm but is not limited to this thickness. In an embodiment, the block mask 1418 may be formed by performing a spin-coating process and thereafter drying the OPL material.

Figure 15:
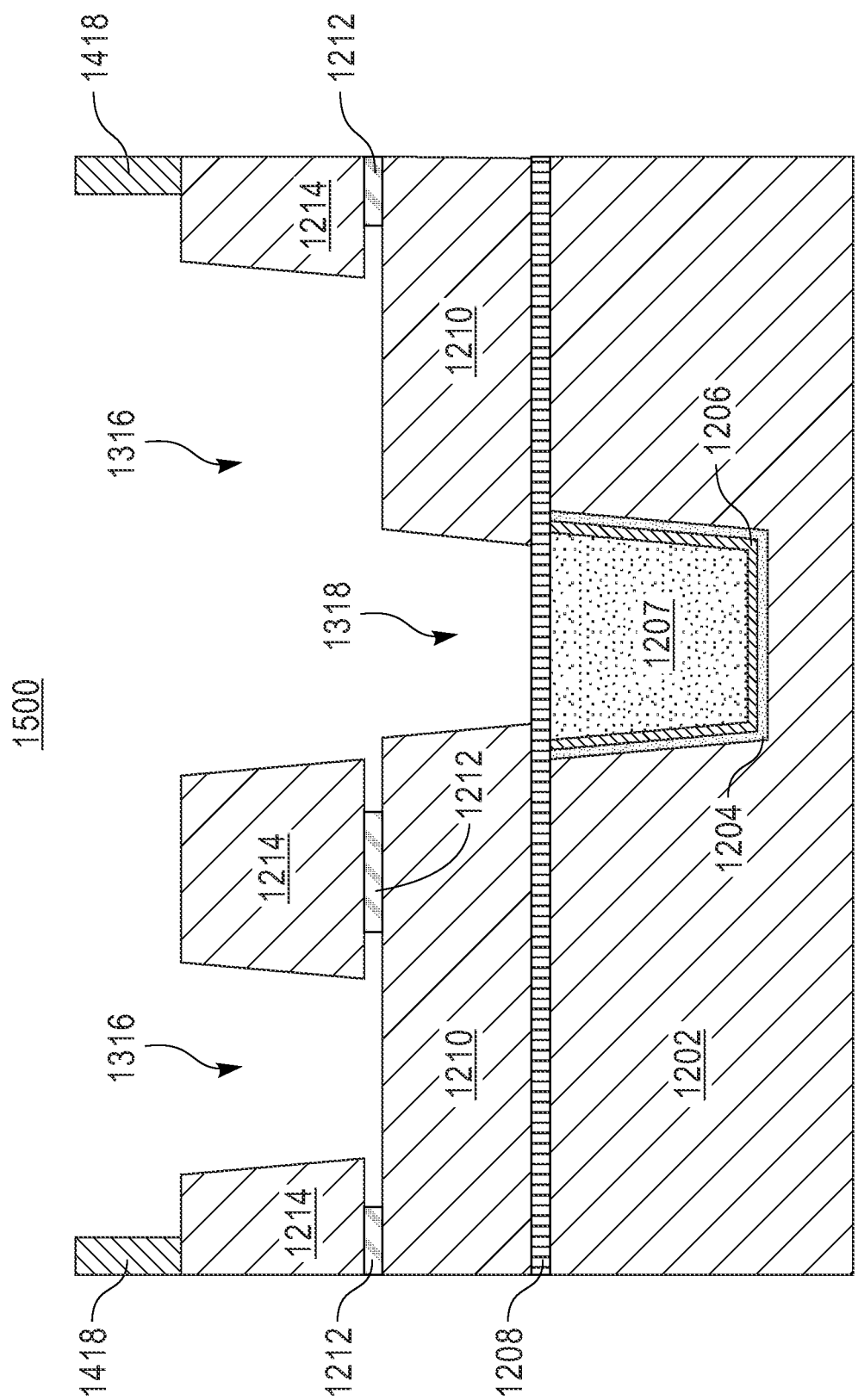
FIG. 15 depicts a cross-sectional view of the semiconductor structure after removing the exposed portions of the etch stop layer in accordance with a second embodiment of the present invention.

FIG. 15 depicts a cross-sectional view of the semiconductor structure 1500 after removing the exposed portions of the etch stop layer 1212. The exposed portions of the etch stop layer 1212 not covered by the block mask 1412 are laterally etched using wet etching or any other etching process known in the art. In an embodiment, the exposed portions of the etch stop layer 1212 not covered by the block mask 1412 are etched using anisotropic etch processes. In an embodiment, 3 nm to 40 nm of lateral distance of etch stop layer 1212 are removed but it is not limited to this range. In an embodiment, the lateral etch range of etch stop layer 1212 is dependent on the pitch of the metal lines. In an embodiment, deeper wet etching is needed the wider the pitch of the metal lines.

Figure 16:
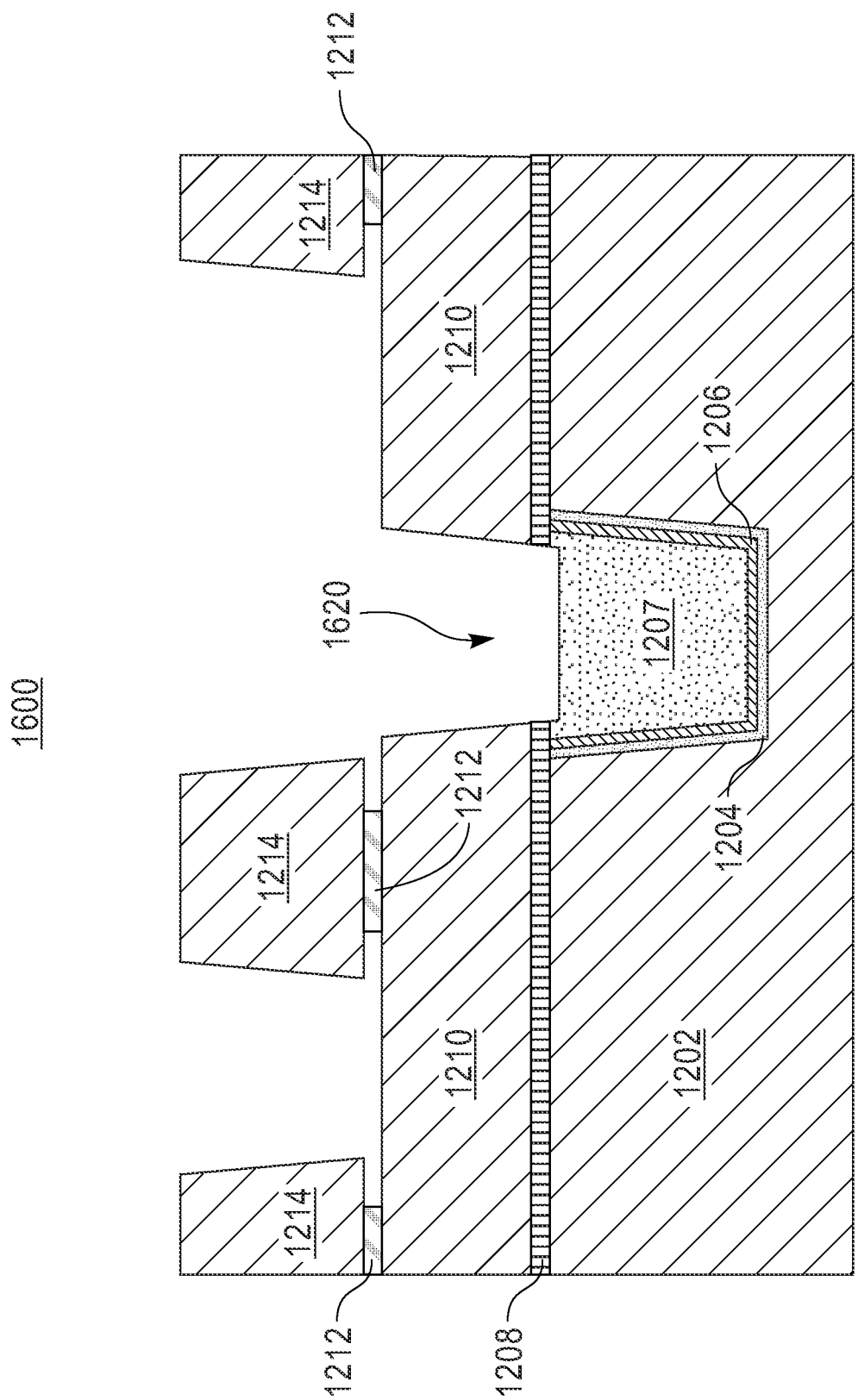
FIG. 16 depicts a cross-sectional view of the semiconductor structure after removing the block mask layer and the exposed portions of the capping layer in accordance with a second embodiment of the present invention.

FIG. 16 depicts a cross-sectional view of the semiconductor structure 1600 after the removal of the block mask 1412 and the exposed portions of capping layer 1208. The block mask 1412 and capping layer 1208 are selectively removed using etching or any other process known in the art.

Figure 17:
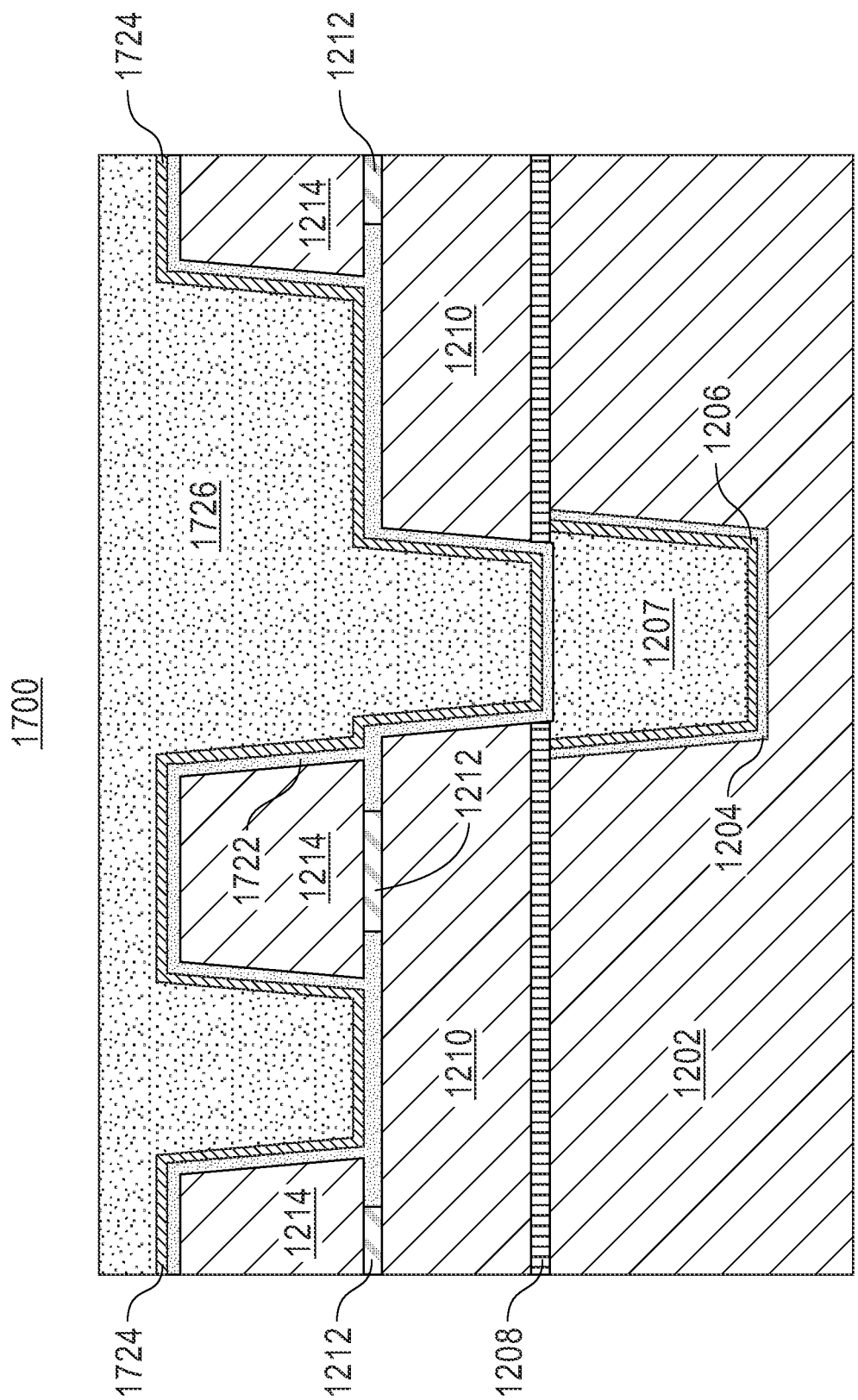
FIG. 17 depicts a cross-sectional view of the semiconductor structure after depositing a barrier layer on top of the first low-k dielectric layer, second low-k dielectric layer and up to the etch stop layer between the first low-k dielectric layer and second low-k dielectric layer, depositing a liner layer on top of the barrier layer and depositing a metal layer on top of the liner layer in accordance with a second embodiment of the present invention.

FIG. 17 depicts a cross-sectional view of the semiconductor structure 1700 after depositing a barrier layer 1722 on top of the first low-k dielectric layer 1210, second low-k dielectric layer 1214 and up to the etch stop layer 1212 between the first low-k dielectric layer 1210 and second low-k dielectric layer 1214. A liner layer 1724 is deposited on top of the barrier layer 1722 and a metal layer 1726 is deposited on top of the liner layer 1724 in accordance with a first embodiment of the present invention. In an embodiment, barrier layer 1722 is TaN, Ta, TiN, WN, or any other material known in the art. In an embodiment, barrier layer 1722 is deposited via sputtering, ALD, CVD, or any other process known in the art. In an embodiment, barrier layer 1722 may range from 0.5 nm to 5 nm in thickness, but not limited to this thickness. In an embodiment, the barrier layer 1722 is deposited between the second low-k dielectric layer 1214 and the first low-k dielectric layer 1210 to form adjacent to the remaining exposed portions of the etch stop layer to form tips of the out of the one or more trenches within the second low-k dielectric layer 1214. In an embodiment, a liner layer 1724 is deposited on top of the barrier layer 1722 via sputtering, ALD, CVD, or any other process known in the art. In an embodiment, liner layer 1724 is Ru, Co, any combination of Ru/Co, or any other material known in the art. In an embodiment, liner layer 1724 may range in thickness from 0.5 nm to 5 nm but limited to this thickness. In an embodiment, a metal layer 1726 is deposited on top of the liner layer 1724. In an embodiment, the metal layer 1726 is deposited using ECP, PVD, CVD, ALD, or any other process known in the art. In an embodiment, metal layer 1726 is Cu, Ru, W, Mo, Jr, Rh or any other material known in the art.

Figure 18:
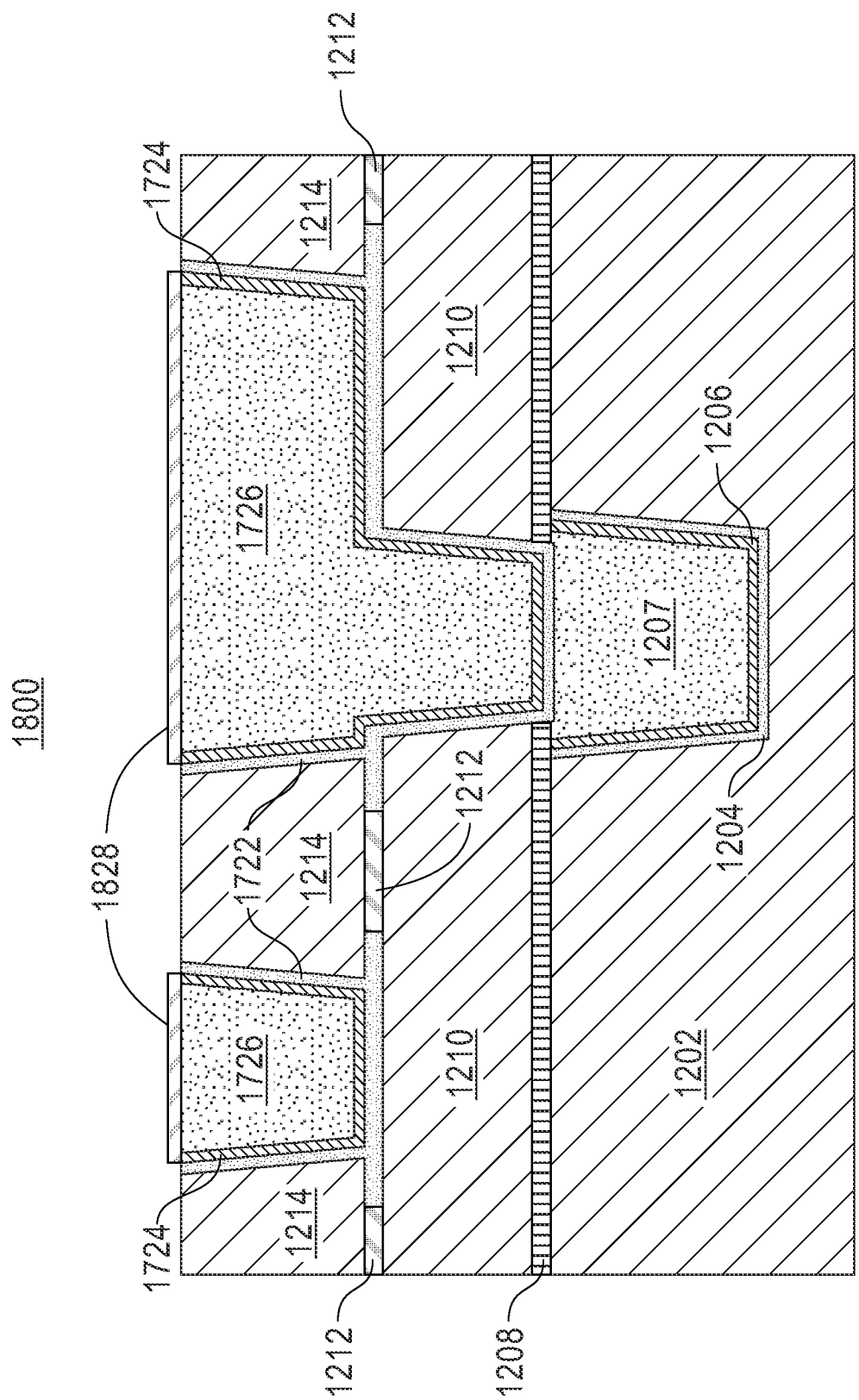
FIG. 18 depicts a cross-sectional view of the semiconductor structure after planarizing the semiconductor structure to remove the barrier layer, liner layer, and metal layer located above the top of the second low-k dielectric layer and additional depositing of a metal cap on top of the remaining metal layer in accordance with a second embodiment.

FIG. 18 depicts a cross-sectional view of the semiconductor structure 1800 after planarization of the semiconductor structure to remove the barrier layer 1722, liner layer 1724 and metal layer 1726 located above the top of the second low-k dielectric layer 1214. A metal cap 1828 is deposited on top of the metal layer 1726 remaining in the patterned 2D horizontal lines. In an embodiment, metal cap 1828 is Cu, Ru, W, Mo, Jr, Rh or any other material known in the art. In an embodiment, the metal cap 1828 is deposited via area-selective deposition. In an embodiment, metal cap 1828 may range in thickness from 0.5 nm to 5 nm but is not limited to this range.

Figure 19:
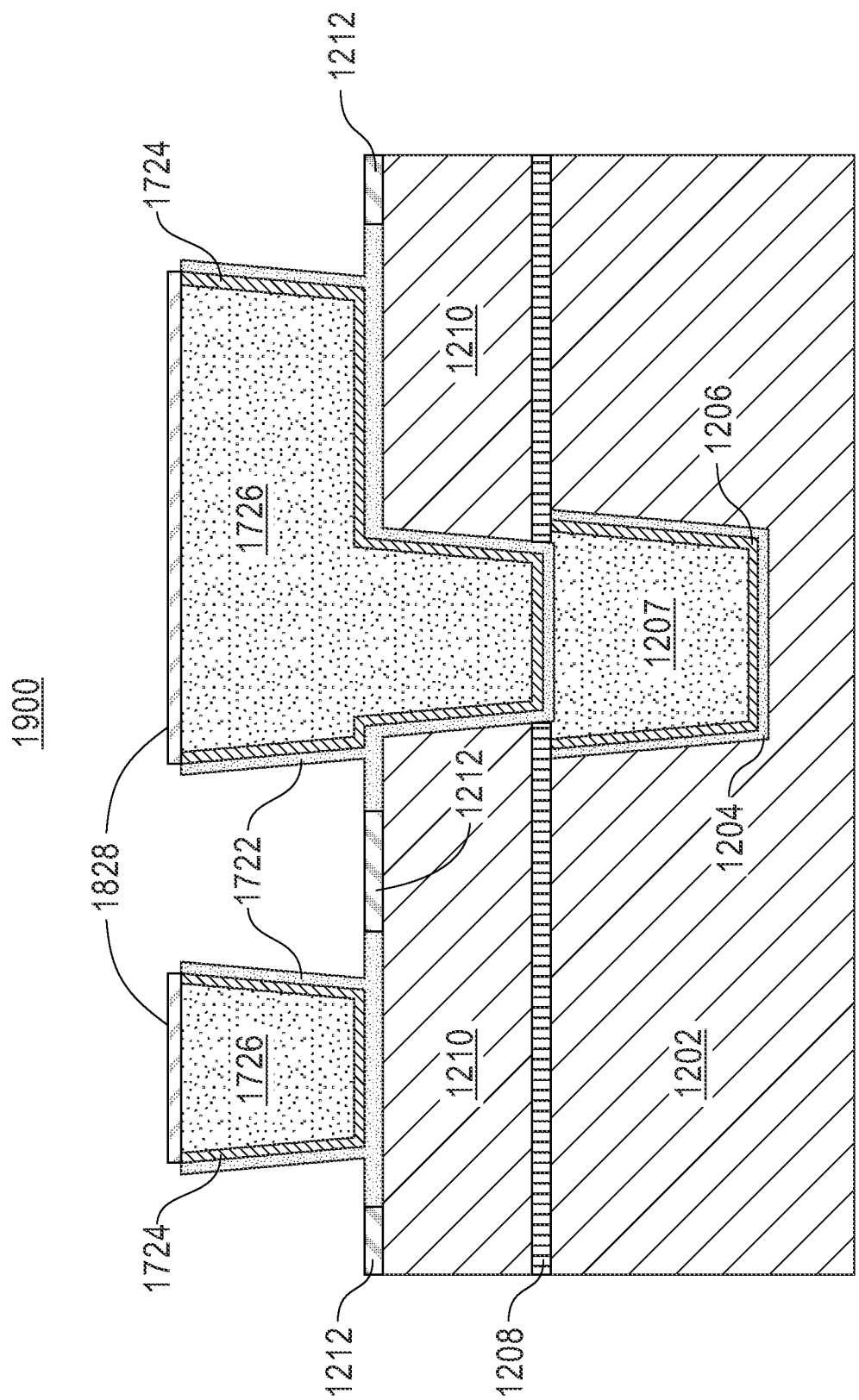
FIG. 19 depicts a cross-sectional view of the semiconductor structure after selectively removing the second low-k dielectric layer in accordance with a second embodiment.

FIG. 19 depicts a cross-sectional view of the semiconductor structure 1900 after selective removal of the second low-k dielectric layer 1214. In an embodiment, the second low-k dielectric layer 1214 is selectively removed using etching or any other process known in the art.

Figure 20:
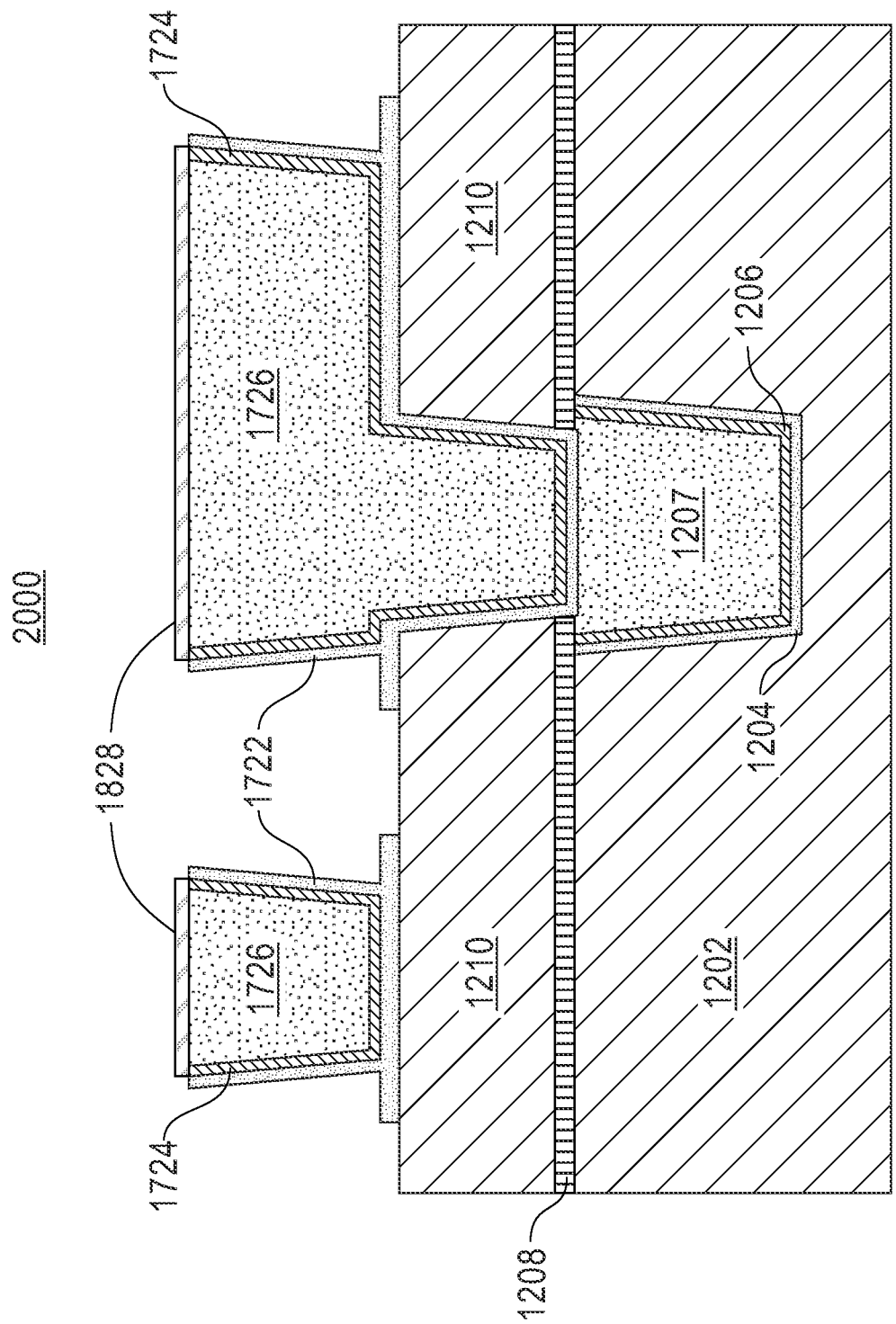
FIG. 20 depicts a cross-sectional view of the semiconductor structure after removing the remaining etch stop layer in accordance with a second embodiment.

FIG. 20 depicts a cross-sectional view of the semiconductor structure 2000 after removal of the remaining etch stop layer 108. In an embodiment, the etch stop layer 1212 is removed using processes known in the art, including, but not limited to wet etching using diluted hydrofluoric acid (dHF).

Figure 21:
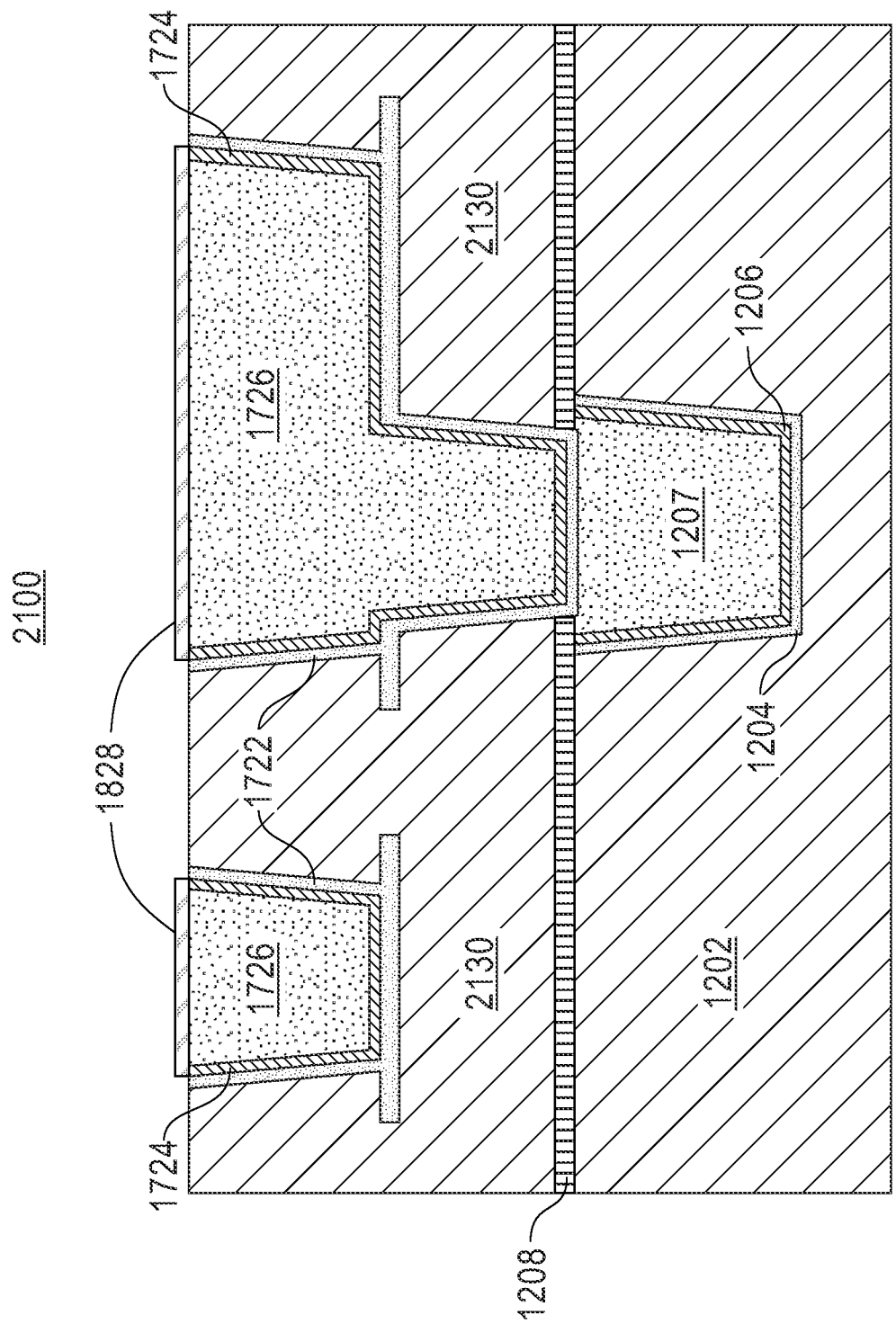
FIG. 21 depicts a cross-sectional view of the semiconductor structure after depositing a third low-k dielectric layer in accordance with a second embodiment.

FIG. 21 depicts a cross-sectional view of the semiconductor structure 2100 after depositing a third low-k dielectric layer 2130. It should be noted, for simplicity the third low-k dielectric layer 2130 is depicted as a single layer however the third low-k dielectric layer 2130 includes parts of the first low-k dielectric layer 1210. The third low-k dielectric layer 2130 is deposited at least to the bottom of the metal cap 1828 and planarized to the bottom of the metal cap 1828.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure comprising:
   a low-k dielectric material on top of a substrate;
   two adjacent metal lines in the low-k dielectric material, wherein the two adjacent metal lines have a liner; and
   a barrier layer contacting the liner and the low-k dielectric material, wherein a portion of the barrier layer extending laterally from each of the two adjacent metal lines embedding into the low-k dielectric material is an anti-fuse.

2. The semiconductor structure of claim 1, wherein the portion of the barrier layer extending laterally from each of the two adjacent metal lines embeds into the low-k dielectric material has a top horizontal surface, a bottom horizontal surface, and a vertical surface, wherein each of the top horizontal surface, the bottom horizontal surface, and the vertical surface directly contact the low-k dielectric material.

3. The semiconductor structure of claim 2, wherein the low-k dielectric material resides between and contacting the vertical surface of each portion of the barrier layer extending laterally from each of the two adjacent metal lines into the low-k dielectric material.

4. The semiconductor structure of claim 3, wherein the liner is composed of a material selected from the group consisting of ruthenium and cobalt.

5. The semiconductor structure of claim 2, wherein the top surface and the bottom surface of the portion of the barrier layer extending laterally from each of the two adjacent metal lines are parallel.

6. The semiconductor structure of claim 1, wherein the portion of the barrier layer extending laterally from each of the two adjacent metal lines that embeds into the low-k dielectric material extends laterally into the low-k dielectric material by at least 3 nm.

7. The semiconductor structure of claim 1, wherein the barrier layer is composed of a material selected from the group consisting of tantalum, titanium nitride, and tungsten.

8. A semiconductor structure comprising:
   a low-k dielectric material on a substrate;
   two adjacent metal lines in the low-k dielectric material;
   a via below and contacting one of the two adjacent metal lines, wherein the via is composed of a same metal as the two adjacent metal lines;
   a liner surrounding sidewalls and bottom surfaces of the two adjacent metal lines and the via; and
   a barrier layer contacting the liner and the low-k dielectric material, wherein a portion of the barrier layer extending laterally from each of the two adjacent lines embedding into the low-k dielectric material between the two adjacent metal lines is an anti-fuse.

9. The semiconductor structure of claim 8, wherein the portion of the barrier layer extending laterally into the low-k dielectric material between the two adjacent metal lines has a top horizontal surface, a bottom horizontal surface, and a vertical surface, wherein each of the top horizontal surface, the bottom horizontal surface, and the vertical surface directly contact the low-k dielectric material.

10. The semiconductor structure of claim 9, wherein the low-k dielectric material resides between and contacting the vertical surface of the portion of the barrier layer extending laterally into the low-k dielectric material between the two adjacent metal lines.

11. The semiconductor structure of claim 9, wherein the portion of the barrier layer extending laterally into the low-k dielectric material between the two adjacent metal lines has the horizontal surface below a bottom surface of the two adjacent metal lines.

12. The semiconductor structure of claim 9, wherein the top surface and the bottom surface of the portion of the barrier layer extending laterally from each of the two adjacent metal lines are parallel.

13. The semiconductor structure of claim 9, wherein the low-k dielectric material resides between and contacting the vertical surface of each portion of the barrier layer extending laterally from each of the two adjacent metal lines into the low-k dielectric material.

14. The semiconductor structure of claim 8, wherein the barrier layer is composed of a material selected from the group consisting of tantalum, titanium nitride, and tungsten.

15. The semiconductor structure of claim 14, wherein the liner is composed of a material selected from the group consisting of ruthenium and cobalt.

16. The semiconductor structure of claim 8, wherein the portion of the barrier layer extending laterally from each of the two adjacent metal lines embeds into the low-k dielectric material and extends laterally into the low-k dielectric material by at least 3 nm.

\* \* \* \* \*